United States Patent
Robinson

[11] Patent Number: 5,937,423
[45] Date of Patent: Aug. 10, 1999

[54] REGISTER INTERFACE FOR FLASH EEPROM MEMORY ARRAYS

[75] Inventor: Kurt B. Robinson, Newcastle, Calif.

[73] Assignee: Intel Corporation, Santa Clara, Calif.

[21] Appl. No.: 08/773,168

[22] Filed: Dec. 26, 1996

[51] Int. Cl.[6] .................................................. G06F 12/02
[52] U.S. Cl. ........................................... 711/103; 365/52
[58] Field of Search ....................... 711/103; 365/185.33, 365/185.11, 52

[56] References Cited

U.S. PATENT DOCUMENTS

| | | | |
|---|---|---|---|
| 5,053,990 | 10/1991 | Kreifels et al. ........................ | 564/900 |
| 5,307,320 | 4/1994 | Farrer et al. ........................ | 365/230.01 |
| 5,341,330 | 8/1994 | Wells et al. .............................. | 365/185 |
| 5,341,339 | 8/1994 | Wells ..................................... | 365/218 |
| 5,375,222 | 12/1994 | Robinson et al. . | |
| 5,430,857 | 7/1995 | Kendall ................................. | 395/400 |
| 5,455,800 | 10/1995 | Wells et al. ............................. | 365/218 |
| 5,459,850 | 10/1995 | Clay et al. . | |
| 5,473,765 | 12/1995 | Gibbons et al. . | |
| 5,475,693 | 12/1995 | Christopherson et al. ............ | 371/10.2 |
| 5,508,971 | 4/1996 | Cernea et al. . | |
| 5,524,231 | 6/1996 | Brown .................................... | 395/428 |
| 5,535,369 | 7/1996 | Wells et al. ............................. | 711/171 |
| 5,541,886 | 7/1996 | Hasbun ................................ | 365/230.01 |
| 5,544,356 | 8/1996 | Robinson et al. ...................... | 395/600 |
| 5,581,723 | 12/1996 | Hasbun et al. .......................... | 395/430 |
| 5,592,669 | 1/1997 | Robinson et al. ...................... | 395/622 |
| 5,603,001 | 2/1997 | Sukegawa et al. ...................... | 395/430 |
| 5,627,782 | 5/1997 | Tanaka et al. ...................... | 365/185.22 |
| 5,628,028 | 5/1997 | Michelson . | |
| 5,630,093 | 5/1997 | Holzhammer et al. ................. | 395/442 |
| 5,640,507 | 6/1997 | Lipe .................................... | 395/183.01 |
| 5,640,529 | 6/1997 | Hasbun ................................. | 711/103 |
| 5,668,976 | 9/1997 | Zook . | |
| 5,671,374 | 9/1997 | Postman et al. ........................ | 395/309 |
| 5,671,388 | 9/1997 | Hasbun ................................... | 395/430 |
| 5,684,997 | 11/1997 | Kau et al. ............................... | 395/733 |
| 5,696,929 | 12/1997 | Hasbun et al. .......................... | 395/430 |
| 5,727,057 | 3/1998 | Emery et al. ............................ | 379/211 |
| 5,740,395 | 4/1998 | Wells et al. ............................. | 395/430 |
| 5,754,567 | 5/1998 | Norman ............................... | 371/40.18 |
| 5,761,732 | 6/1998 | Shaberman et al. .................... | 711/157 |

*Primary Examiner*—John W. Cabeca
*Assistant Examiner*—Felix B. Lee
*Attorney, Agent, or Firm*—Blakely, Sokoloff, Taylor & Zafman

[57] ABSTRACT

A flash EEPROM memory device including a memory array having a plurality of blocks of flash EEPROM memory cells arranged to be accessed in rows and columns, a query memory storing data defining characteristics of the flash storage device, and a register interface for receiving data and commands addressed to the blocks of flash EEPROM memory devices and generating signals for affecting the purpose of the commands in the device, the interface including a command register for receiving commands and a plurality of registers for providing the data stored in the query memory as output.

13 Claims, 4 Drawing Sheets

| SECTION NAME | OFFSET | LENGTH (BYTES) | DESCRIPTION |
|---|---|---|---|
| RESERVED | 00h | 16 | VENDOR SPECIFIC INFORMATION |
| CFI QUERY ID | 10h | 11 | COMMAND SET ID AND OEM DATA OFFSET |
|  | 10h | 3 | ASCII "QRY" |
|  | 13h | 2 | PRIMARY COMMAND SET CODE |
|  | 15h | 2 | ADDRESS OF PRIMARY COMMAND SET CODE |
|  | 17h | 2 | ALTERNATE COMMAND SET CODE |
|  | 19h | 2 | ADDRESS OF ALTERNATE COMMAND SET CODE |
| SYSTEM INTERFACE | 1Bh | 12 | DEVICE TIMING AND VOLTAGE INFORMATION |
|  | 1Bh | 1 | $V_{CC}$ LOGIC SUPPLY VOLTAGE MINIMUM |
|  | 1Ch | 1 | $V_{CC}$ LOGIC SUPPLY VOLTAGE MAXIMUM |
|  | 1Dh | 1 | $V_{PP}$ PROGRAMMING SUPPLY VOLTAGE MINIMUM |
|  | 1Eh | 1 | $V_{PP}$ PROGRAMMING SUPPLY VOLTAGE MAXIMUM |
|  | 1Fh | 8 | SYSTEM TIMING DATA |
| DEVICE GEOMETRY | 27h | 10 | FLASH DEVICE LAYOUT |
|  | 27h | 1 | DEVICE SIZE |
|  | 28h | 2 | CODE DESCRIBING DEVICE INTERFACE |
|  | 2Ah | 2 | MAXIMUM BYTES IN MULTI-BYTE WRITE |
|  | 2Ch | 1 | NUMBER OF ERASE BLOCK REGIONS IN DEVICE |
|  | 2Dh | 4 | CODE DEFINING SIZE & # OF ERASE BLOCKS IN REGION |
| OFFSET ADDRESS P | (P)h | VARIABLE | OPTIONAL EXTENDED PRIMARY QUERY STRUCTURE |
|  | (P)h | 3 | ASCII "PRI" |
|  | (P+3)h | 1 | MAJOR VERSION NUMBER |
|  | (P+4)h | 1 | MINOR VERSION NUMBER |
|  | (P+5)h | VARIABLE | PRIMARY EXTENDED QUERY TABLE CONTENTS |
| OFFSET ADDRESS A | (A)h | VARIABLE | ALTERNATE EXTENDED QUERY TABLE STRUCTURE |
|  | (A)h | 3 | ASCII "ALT" |
|  | (A+3)h | 1 | MAJOR VERSION NUMBER |
|  | (A+4)h | 1 | MINOR VERSION NUMBER |
|  | (A+5)h | VARIABLE | ALTERNATE EXTENDED QUERY TABLE CONTENTS |

FIGURE 4

REGISTER INTERFACE FOR FLASH EEPROM MEMORY ARRAYS

FIELD OF THE INVENTION

This invention relates to flash electrically-erasable programmable read only memory ("EEPROM") and, more particularly, to methods and an apparatus for providing an interface for flash EEPROM memory arrays that allows determination of the characteristics of the memory array.

BACKGROUND OF THE INVENTION

Flash EEPROM memory arrays are being used for many purposes in present day digital systems (e.g., computers) because of the ability of flash EEPROM memory arrays to retain data when power is removed and to be easily reprogrammed without being removed from a system. A flash EEPROM memory array is comprised of floating gate field effect transistor devices arranged in row and column fashion. The charge stored on the floating gate of such a memory transistor may be changed by programming, and the state of the charge may be detected by sensing voltage across the device. Because these flash EEPROM arrays may be easily reprogrammed, they are being used as substitutes for normal EPROM arrays to provide read-only memory that may be easily updated.

A flash memory array is accessed for reading and writing in the same manner as are dynamic random access memory (DRAM) arrays using row and column addressing in byte, word, or larger sequences of bits. However, because of the manner in which data is stored, a flash memory array, unlike a typical DRAM device, cannot be overwritten without first erasing the memory cells. Flash memory arrays used as substitutes for EPROM arrays are typically erased in large blocks (that may constitute the entire array) before being reprogrammed.

Flash EEPROM memory arrays are also being used to provide smaller lighter functional equivalents of electromechanical hard disk drives. Flash memory arrays designed to replace hard disk drives (referred to herein as "flash disk drives") operate more reliably and are not as sensitive to physical damage as electro-mechanical hard disk drives. Because of these characteristics, flash disk drives are especially useful in portable computers where space is at a premium and weight is important.

Electro-mechanical disk drives have historically used an industry standard interface referred to as an "ATA interface." The ATA interface was specifically designed to provide communication between a computer system and a rotating electro-mechanical disk drive. Because of this, the ATA interface was defined in terms of primitive functions that are directly applicable to directly-overwritable, block read/write, rotating media. Such primitive functions include "do a slow seek for a logical address or a cylinder head sector," "read a sector or multiple sectors," and "write a sector."

On the other hand, exemplary flash EEPROM array primitive functions include "read and write at the byte, word, or small block level" and "erase at a large block level." The ATA interface does not communicate in flash memory array primitives. When a flash disk drive replaces an electro-mechanical disk drive, it uses the ATA interface to communicate with other computer components. Therefore, it has been necessary to provide circuitry by which the signals used by a computer to access electro-mechanical hard disk drives may be understood by the flash disk drive. The process of translating electro-mechanical rotating disk drive functions to flash disk drive functions has required a substantial amount of hardware and software.

For example, one type of flash disk drive uses a hardware device command user interface on the silicon substrate (chip) of each flash memory device that makes up the flash memory array to accomplish the row and column accesses necessary to operate the flash device. Each flash memory device command user interface typically includes state machines that receive commands from an external hardware flash disk drive command user interface interposed between the bus and the flash array. This external flash disk drive command user interface decodes the ATA rotating disk commands and generates commands adapted to carry out the purposes of the ATA commands within each flash memory device of the flash memory array. The flash disk drive command user interface controls the operations necessary to access the flash disk drive by sending the translated commands to the appropriate ones of the individual flash memory device command user interfaces.

Recently, there has appeared a lower cost alternative to a flash disk drive that combines disk emulation software running on a host computer with a low cost flash memory device array. The flash memory device array comprises one or more flash memory devices contained in one of several system packaging options, including a removable memory card, a system-resident single-in-line-memory module (SIMM), and a resident flash array (devices mounted directly on the system motherboard). The combination of any one of these plain flash memory device subsystems with disk emulation software is referred to in this specification as a flash disk emulator.

Many of the operations necessary for either a command user interface or a flash disk emulator to translate from commands phrased in primitives of a rotating disk are quite complicated. For example, in some flash disk drives and other flash storage devices, data is first written to empty blocks of the memory array chosen under control of the command user interface; and then the physical address at which the data is stored is recorded in lookup tables along with the rotating disk addresses provided externally. This allows the data to be recovered when the rotating addresses are provided.

Early flash memory arrays addressed data in single bytes. As flash memory arrays have evolved, addressing in words and double words have become possible, often in the same array. The ability to provide these different forms of addressing have complicated the operations of the device command user interface. Recently, flash memory arrays have been devised that use buffering to allow the transfer of large amounts of data even though the array cannot immediately handle that data because of its slower combined erasing and writing speed.

These enhancements increase the complexity of flash disk drive and flash emulator operations.

The basic requirement that flash memory be erased in large blocks further complicates operations that flash disk drives and flash disk emulators must carry out. When data are updated, stale data that cannot be overwritten must be marked invalid, the new data must be written to empty array space, and the address tables must be updated to provide a new physical address. This method of updating causes the data in a file to be written to discontiguous positions. When a sufficient amount of data in a large block becomes invalid, the remaining valid data must be copied to empty array space in some other block, the address tables must be updated, and the block must be erased to recover the array space. In prior art devices, this has required means for determining the status of individual blocks and cells of each device at all times.

The writing of flash EEPROM devices is slower than writing DRAM memory because storing data on the floating gate of a transistor requires substantial voltages and relatively long charging times. Both the writing process and the copy process are thus too long to be competitive with DRAM write times. A write state machine is typically positioned on the chip to assist a device command user interface and is used to conduct write and copy operations so that data is accurately stored without overwriting other data in the array. Moreover, the erase process (a process not required by DRAM or electro-mechanical memory) is typically slow, as long as one-half second for some flash drives. Because of this, the erase process is typically conducted as a background process run by the write state machine or by additional on-chip state machines under control of the flash disk drive firmware or flash disk emulator software operating beneath their respective command user interfaces. Substantial resources have been required to keep track of block status in order to accomplish these operations. The time required to conduct erase operations is such that some flash memory device command user interfaces accepts commands that suspend the erase operation to allow various other operations to occur.

Recently, flash memory arrays have been devised that allow the storage of more than one bit of data in a single memory cell. This has substantially increased the complication of the circuitry required to translate commands and data between the flash memory array and the ATA (flash disk drive) and flash disk emulator interfaces. As will be understood, all of this overhead is expensive and slows the operation of the flash memory array.

The ATA interface hides the complexity of the underlying flash disk drive internal software (firmware). A host system typically employs a single ATA device driver that translates instructions from the disk file system maintained by the operating system such as the boot parameter block/file allocation table ("BPB/FAT") file system in the Microsoft DOS and Windows operating systems. This driver is used by all ATA-compatible devices, both rotating and flash-based. The ATA interface was designed to provide forward and backward compatibility for all ATA devices without requiring software updates to the host system device driver. However, the ATA interface, as presently constituted, eliminates the ability to use the flash memory arrays for many operations for which transistor memory is especially well suited. For example, even though a flash memory array may inherently be accessed as rapidly as dynamic random access memory, direct random access is not possible using the ATA interface because of the translation overhead and because of the manner in which data is stored. Because the cells of flash memory arrays cannot be over-written and consequently store file data in discontiguous positions of the flash array, a data file that is read from a flash memory array must be reassembled in main memory before it can be used. Because memory management of the flash memory array makes it necessary to reconstruct files read from flash storage devices in DRAM memory before use, direct execution of applications has been foreclosed in flash disk drives with an ATA interface.

Even if it were possible to store the portions of an application contiguously in a flash memory device, executing an application directly from a flash memory device would be very difficult. First, the ATA interface does not provide any direct access to the memory array for direct execution of instructions in the access time that a basic flash memory itself provides for read operations. Moreover, there is simply no manner of determining the characteristics of the particular flash memory device with which communication is being attempted so that communications can be carried on directly in terms by which the data in the array may be manipulated.

Because of these problems, flash disk drives have typically been used for long term storage of data where the ability to read and write data rapidly is not crucial.

Currently a flash disk emulator has strengths and weaknesses that contrast with those of an ATA-compatible flash drive. The flash disk emulator consists of a two-layer software driver and a memory card or other flash array. The upper level driver layer is referred to as a flash translation layer ("FTL") driver (PCMCIA specification release date May 1996) while each low level driver ("LLD") is usually designed by an original equipment manufacturer and is unique to the flash memory device and card combination. In addition to supporting disk emulation, the memory card or array can be partitioned in one or more additional regions that can support direct random memory access. Thus, a "plain" flash memory card or flash array allows the host system and its user to take advantage of fast direct access to the flash memory device contents in support of direct code execution.

The disadvantage of current flash disk emulator implementations is the custom nature of the low level driver. A low level driver currently reads a device identifier ("device ID") and refers to a lookup table to determine both a command sequence or algorithm and a set of card and/or device geometry and system interface parameters such as voltage and timing to be used with that device.

Such a driver has no way of determining the characteristics of any particular flash memory device with which it is associated except through the lookup table. Consequently, when a new flash memory device is introduced to the host system, the host cannot recognize the new device identifier and therefore cannot use the new card/device combination. This prevents forward compatibility and creates hardship for the typical flash card user who cannot easily find or implement the new required device driver. Because each low level driver must be written to include the particular disk emulator, each time an enhanced version of a flash memory device appears the low level driver must be rewritten to include the new features that the flash memory device offers. For example, drivers must be rewritten to include larger data words, increased buffer transfer size, and the like.

Furthermore, when a new device driver is being made available for the host system, the software writer faces code size and complexity constraints that may lead to a decision to drop older device algorithms. Hence, the new driver may sacrifice backward compatibility.

SUMMARY OF THE INVENTION

It is desirable to provide an interface for a flash storage device that allows communications with the flash memory array in the primitive terms used to control the flash memory array within such a flash storage device so that the device may be used for purposes for which transistor memory arrays are especially suited.

It is also desirable for devices using flash memory arrays to include a compatible interface by which the characteristics of the devices may be determined to provide initialization values for software drivers.

A device is described that includes a memory array, a query memory, and a register interface. The memory array includes a plurality of blocks of flash EEPROM memory devices arranged to be accessed in rows and columns. The query memory stores data defining characteristics of the flash memory device. The register interface receives data and commands addressed to the flash memory devices. The register interface generates signals for effecting the purpose of the commands within the flash memory devices. The register interface includes a command register for receiving commands. The register interface also includes a plurality of additional registers for returning data stored in the query memory as an output.

Other objects, features, and advantages of the present invention will be apparent from the accompanying drawings and from the detailed description that follows below

BRIEF DESCRIPTION OF THE DRAWINGS

The present invention is illustrated by way of example and not limitation in the figures of the accompanying drawings, in which the references indicate similar elements, and in which:

FIG. 4 is a diagram illustrating signals that may be returned in response to a query command with respect to a flash memory device.

DETAILED DESCRIPTION

As described in more detail below, an embodiment of the invention includes a register interface for connecting a long term memory device including a flash EEPROM memory device array designed to accept a query command from other components of a computer system and return data that defines the physical properties and the functions of the flash memory device in terms that directly relate to a flash EEPROM memory array. The data derived by a query command may be used to initialize a system device driver to provide commands that most effectively manipulate data in the flash memory device.

Figure 1:
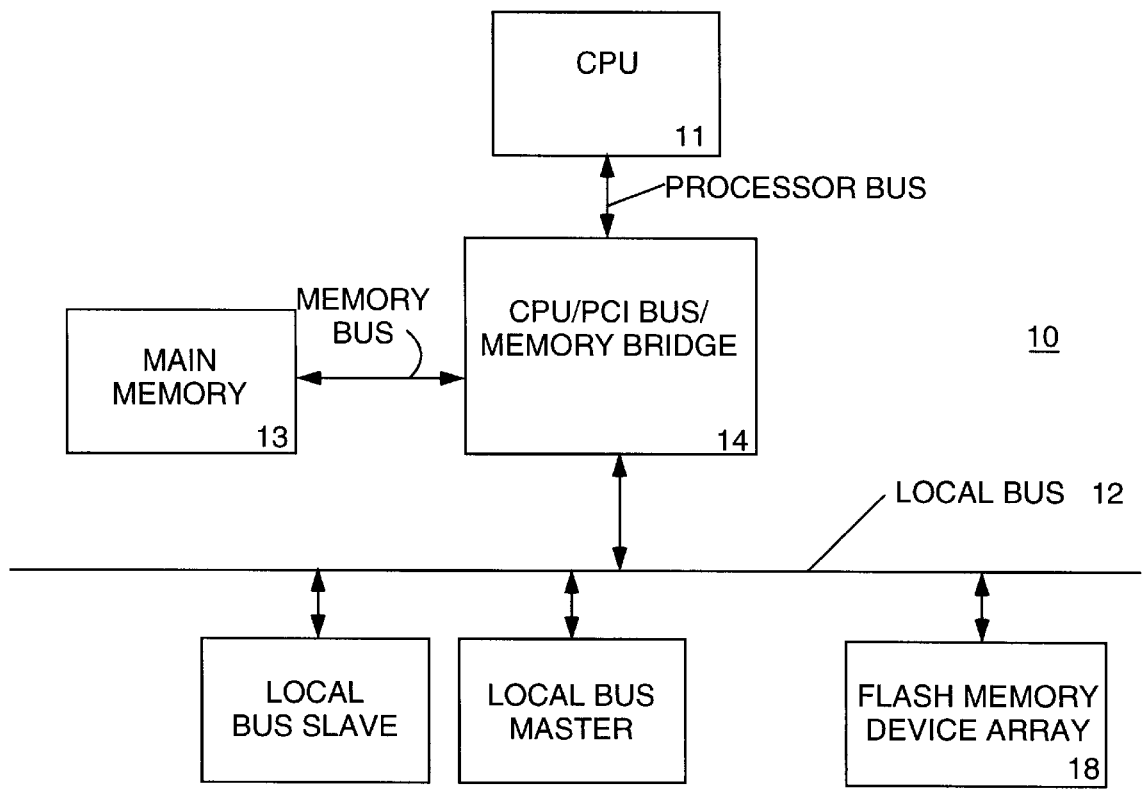
FIG. 1 is a block diagram of a computer system with a flash memory device array.

FIG. 1 is a block diagram of a computer system 10 configured in accordance with one embodiment of the present invention. For one embodiment, computer system 10 is a personal computer or a laptop computer. For other embodiments, computer system 10 resides within a cellular telephone, a digital camera, a personal digital assistant, or other apparatus under computer control. The system 10 illustrated includes a central processing unit ("CPU") 11 that executes the various instructions provided to control the operations of the system 10. For one embodiment, CPU 11 is a microprocessor. For other embodiments, CPU 11 is a microcontroller or other type of processor. CPU 11 is joined by a processor bus to a bridge circuit 14 that controls access to an input/output bus 12 adapted to carry information between the various components of the system 10. The bridge 14 is also joined by a memory bus to main memory 13 that is typically constructed of dynamic random access memory arranged to store information during a period in which power is provided to the system 10. In FIG. 1, the bus 12 is preferably a peripheral component interface ("PCI") bus or other local bus adapted to provide especially fast transfers of data. For other embodiments, other types of buses may be used. Various input/output devices are connected as bus master and bus slave circuits to the bus 12. Flash memory device array 18 is connected to PCI bus 12. For an alternative embodiment, flash memory device array 18 is joined to a secondary bus (not shown), such as an Industry Standard Association ("ISA") bus or an Extended Industry Standard Association ("EISA") bus. For one embodiment, flash memory device array 18 uses the interface described in more detail below to connect to a bus.

Figure 2:
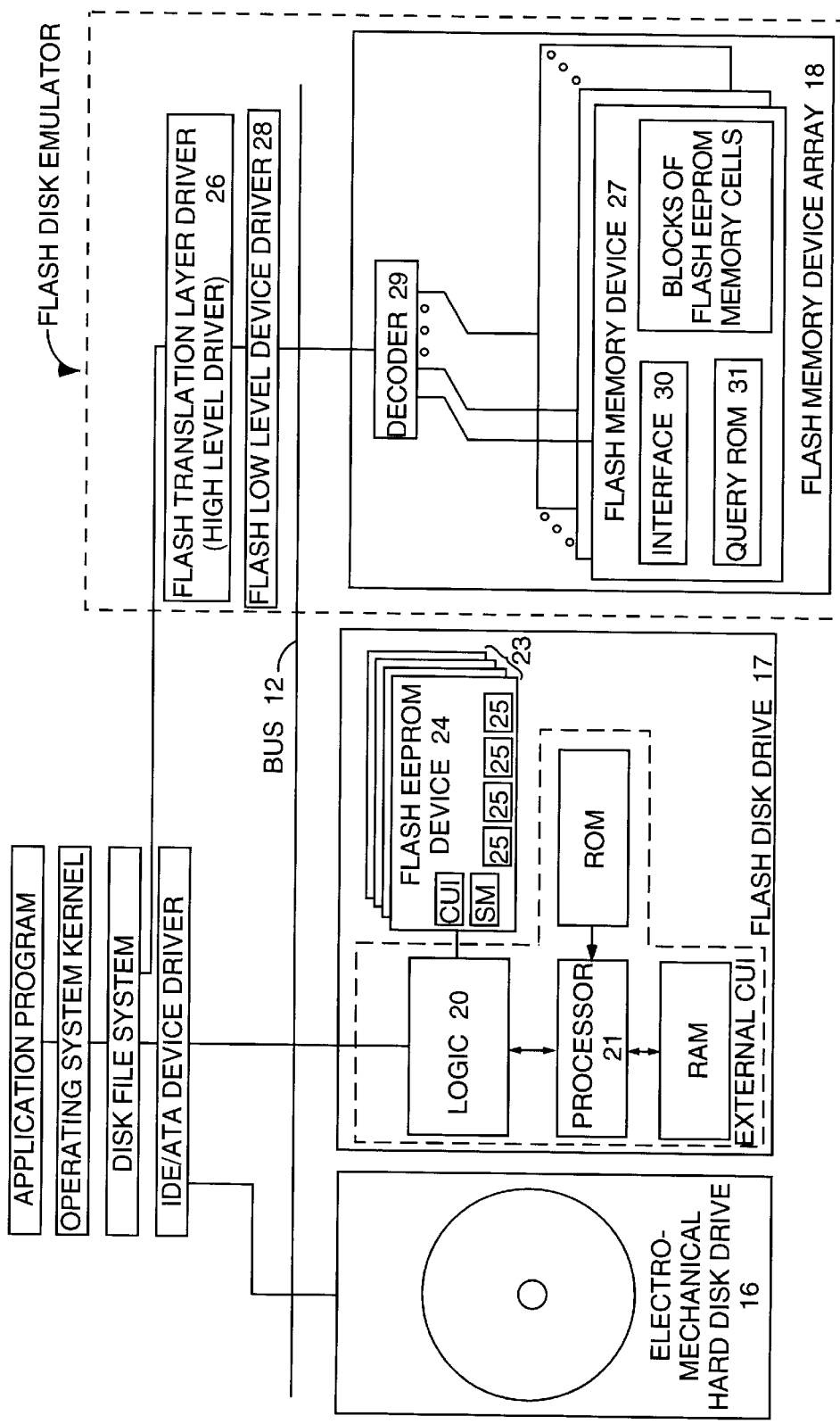
FIG. 2 is a block diagram of a prior art electromechanical hard disk drive, a prior art flash disk drive, and a flash memory device array designed in accordance with one embodiment of the present invention.

Flash memory device array 18 is a long term memory. Flash memory device array 18 may be a flash memory card or other type of flash memory array such as a single-in-line-memory module or a resident flash array. In the past, long term memory would typically be an electro-mechanical hard disk drive. However, a flash EEPROM memory array in the form of a flash disk drive or a flash memory device array may be used in place of such a hard disk drive as the long term memory. In order to illustrate differences from the prior art, FIG. 2 shows three types of long term memories coupled to bus 12, namely, a prior art electromechanical hard disk drive 16, a prior art flash disk drive 17, and a flash memory device array 18, the latter being one embodiment of the present invention. Flash memory device array 18 may be used as the long term memory in place of electromechanical hard disk drive 16. Flash memory device array 18 or any flash memory array may be one in which a memory cell stores a single bit of data or one in which a memory cell may store more than one bit of data. A flash disk drive may include an array of one or more flash memory devices each having circuitry for reading, programming (writing), and erasing the cells of that flash memory device and circuitry external to the flash memory device for controlling the operations of the entire memory array. A flash disk emulator typically employs a flash memory device array that includes an array of one or more flash memory devices in which the circuitry for reading, programming, and erasing the cells of each flash memory device is contained completely within each such device.

FIG. 2 illustrates a system software/hardware interface provided at a bus 12 to which are coupled an ATA compatible electro-mechanical hard disk drive 16, the flash disk drive 17, and flash memory device array 18. FIG. 2 illustrates a software application program located in system memory executing on a computer microprocessor with the assistance of an operating system that controls access to various input/output devices of the computer. The operating system includes an operating system kernel that maintains a software disk file system in memory through which the various files are maintained. The operating system uses the disk file system to store and retrieve data from files kept in the memory system of the computer. When a file is stored on the electromechanical disk drive 16, the operating system transfers control to a software IDE/ATA device driver that is used to access the drive 16 and is maintained as a part of the operating system.

Similarly, if a file is stored on a flash disk drive 17, access is obtained through the operating system using the same IDE/ATA device driver. In the arrangement illustrated, the flash disk drive 17 receives commands and data related thereto from the ATA device driver defined in terms that are directly useful to a rotating electro-mechanical hard disk drive. Because an ATA device driver is designed to provide information for an electro-mechanical hard disk drive, the commands transferred to the flash disk drive 17 from the ATA device driver may direct that a seek operation for a particular rotating hard disk drive sector should be accomplished, that a read of one of more such sectors should occur, or that similar sector-related operations should take place.

The prior art flash disk drive 17 illustrated in FIG. 2 includes an array 23 of flash EEPROM memory devices that is designed to be accessed using chip, block, row, and column addressing. To deal with commands designed for a rotating disk device in accessing a row and column device, the flash disk 17 includes external command user interface ("CUI") circuitry for receiving and handling commands addressed to a plurality of silicon chips that together constitute a flash memory array 23. In one embodiment, this external command user interface circuitry includes an ASIC logic block 20 that receives commands furnished by the ATA device driver on the PCI bus 12. The logic block 20 is assisted by a processor 21 having associated random access memory and read only memory for assisting its operation. These together form what is in effect a small general purpose computer for carrying out the various operations directed to the flash disk drive 17. The logic block 20 accepts commands directed to that drive 17 and with the help of the processor 21 translates those commands and the associated addresses into information that is useful for accessing a row and column array. The logic block 20 and the processor 21 may be considered to function as an overall command user interface for the flash disk drive 17.

The flash memory array 23 shown includes flash EEPROM devices 24 each having a number of blocks 25 of memory transistors. One embodiment includes thirty-two individual large blocks, each having sixty-four kilobytes of flash EEPROM memory cells. Each device 24 also includes circuitry for controlling the application of signals and voltages to accomplish the read, write, copy, and erase functions in the individual blocks. Each flash EEPROM device 24 of the array 23 includes a command user interface ("CUI") including one or more state machines. A typical flash device command user interface is designed to receive all commands addressed to the individual flash device 24 from the logic block 20 no matter what their address on the device and use those commands to carry out the different operations commanded. The flash device CUI often uses a write state machine to control write, copy, and erase operations and certain other internal operations of the memory devices of the flash device.

Thus, the command user interfaces within each of the flash memory devices 24 are typically used for erasing the blocks 25 of cells and reading or writing data in row and column addresses while the ATA command user interface (including logic block 20 and processor 21) external to the devices 24 deals in cylinder/head/sector or logical block address representative of a mechanical disk drive.

Prior art flash disk emulators (although not shown in FIG. 2) include a low level driver between the IDE/ATA device driver and the emulator that performs the functions performed in the flash disk drive 17 by the external command user interface made up of the logic block 20 and the processor 21 and associated memory for translating the ATA commands to commands that may be carried out by a row and column array. As pointed out above, such a low level driver is not forward compatible and thus will not function with new flash disk emulators as they appear.

In accordance with one embodiment of the present invention, an apparatus and a method are provided for directly defining the characteristics of flash storage devices in terms of flash EEPROM primitives rather than rotating disk primitives as they have been defined in prior art arrangements. This allows direct access of a flash memory array for reading and executing the data stored therein using software drivers initialized by values obtained as a result of a query function provided by the flash storage device.

In FIG. 2, a new high level software driver 26 is provided as a part of the operating system. This software driver (called a flash translation layer (FTL) driver) translates the information provided from the disk file system to flash EEPROM primitives. The high level driver 26 provides addresses and data to a low level driver 28 particularly adapted to function with the flash device provided. The low level driver 28 provides many of the functions heretofore provided by the command user interface 20 of the flash disk drive 17.

As may be seen in FIG. 2, the flash memory device array 18 includes a plurality of individual flash EEPROM memory devices 27 and a decoder 29 for directing commands to memory cells in blocks of particular devices 27.

The flash memory device array 18 and the two software drivers and 26 together form the flash disk emulator of the present invention (shown enclosed in dotted lines in the FIG. 2). As explained with respect to prior art flash disk emulators, various hardware functions included in the flash disk drive 17 have been replaced by functions within the high and low software drivers. These typically include those required to accomplish translation from ATA primitives to flash memory primitives.

Figure 3:
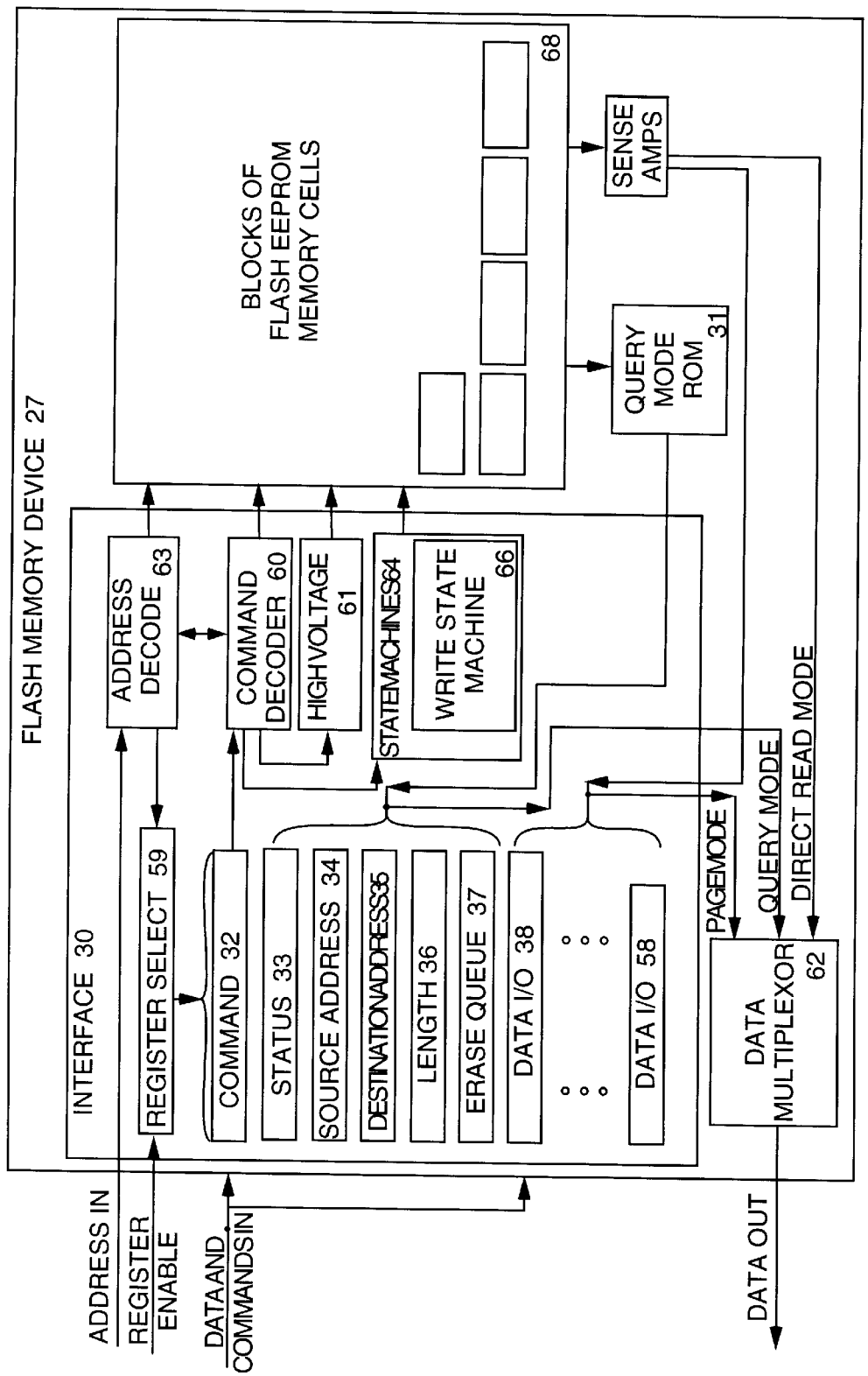
FIG. 3 is a block diagram of a flash memory device.

FIG. 3 illustrates of a flash memory device 27 built in accordance with one embodiment the present invention. The flash memory device 27 of FIG. 3 includes an interface 30 for flash memory device 27. The interface 30 is a register-based interface that may include a number of registers 32–58. Registers 32–58 are arranged to store values for the device drivers 26 and 28 of FIG. 2 that may be directly used to manipulate a flash memory device. The interface 30 includes address decode circuitry 63, command decode circuit 60, and state machines 64. Write state machine 66 is used to assist in programming and erasing the cells of blocks of flash EEPROM memory cells 68. A data multiplexor 62 controls transfer of data out of the device 27.

A command register 32 stores all commands directed to the individual flash memory device 27. A status register 33 provides data regarding the status of erase, write, and copy operations each of which typically requires a significant period to accomplish in a flash memory device 27 and that may, consequently, often be conducted as background operations. A source address register 34 provides an address at which data is to be read from, written to, or erased from the array. A destination address register 35 provides an address to which data is to be copied from an address held in the source register 34. A length register 36 indicates the length of data accessed in any particular operation. An erase queue register 37 may be used to allow a series of blocks of flash memory cells to be erased sequentially. By providing addresses of blocks to be erased in the register 37, the time to set up the high voltages available in high voltage circuitry 61 for the erase operation may be amortized over a significant number of erasures and the overall time of erase reduced. Having a plurality of data I/O registers 38–58 provides a large buffer for the transfer of data to and from the array of the device 27. Each of the registers 32–37 may be described as characteristic registers. Each of the registers 32–58 may be read or written by a processor on the bus 12 through the decoder 29 of FIG. 2.

The device drivers 26 and of FIG. 2 interface with the flash memory device 27 using a command set having basic commands such as a query command, a read command, a write command, a read status command, an erase command, and a suspend command. The command set may also include additional commands adapted to be carried out by the various circuitry under control of these device drivers.

When a command is sent to the command register 32, it is received by the address decode circuit 63 and decoded by logic in the command decoder 60 to initiate an appropriate operation.

Each flash memory device 27 of FIG. 3 includes an identification/query mode read only memory (ROM) 31 in which are stored details of the characteristics of the particular flash memory cell technology and control circuitry for that flash memory device 27. The high level device driver software 26 uses a unique query command that the central processor or other bus master may cause to be written by the drivers to the command decoder 60. The query command is decoded by the command decoder 60 and causes the identification/query mode ROM 31 to respond.

The query command at the command register 32 causes a write of data stored by the query mode ROM 31 that defines the status and type of the flash devices to which the interface 30 is providing access. The query data is written to the data I/O registers 38–58. The data returned may be sent to the register 38 and be clocked serially in a preordered sequence so that it may be read on the bus 12 by a processor. Alternatively, the data from the query mode ROM 31 may be placed in the registers 38–58 and read as a page from those registers.

When the command decoder 60 of the interface 30 decodes the query command held in the command register 32 and interrogates the query mode ROM 31, all of the significant details of the flash memory device 27 become available for initializing the drivers 28 and 26. The data may detail the type of flash device, any partitions into which the array may be divided, the mode in which each partition of the array is operating, and similar information. In one embodiment, the query data returned includes the total size of the array, the size of individual erase blocks, the number blocks in a cluster that may be locked to protect against writing or erasing data, the internal bus width for data transfers that indicates whether any fast transfer modes such as burst transfer of the computer may be used and how much data may be transferred, the size of any write buffer, whether functions such as erase and write may be suspended, the reasons for which suspendable functions may be suspended, whether a ready/busy pin is present, and the revision number of the interface. The query command may also return data indicating whether read and write may take place at the byte level.

In addition, other data returned by a query command may indicate that the array is functioning in a single bit mode, that the array is capable of functioning in a two-state mode or in another multi-bit mode and the number of bits stored in each cell in any such multi-bit mode. In this way, the interface may be used both with arrays that allow a single bit and arrays that allow a plurality of bits to be stored by memory cells. A query response might also indicate to a processor whether the array implements error detection and correction in storing and retrieving data. Other responses to a query command might indicate the type of logical drive the array constitutes, e.g., the array is a PCMCIA or other type of drive. All of this data is provided in the form of primitives that require no translation in order to be used by the drivers with a flash EEPROM memory array.

By using a query command that returns data indicating the physical properties of the array, the interface allows array device driver initialization so that the plurality of commands that are generated by a processor are adapted to cause operations to take place in the manner best suited to the physical properties of the array. The central processing unit in a system using a flash storage device with such an interface may read the results of the query command to determine how it is to interface to any flash storage device placed in the system. By utilizing a command set that is fixed, a query command provides responses that may be used by all vendors in an industry. Even though the command set is fixed in meaning, it also provides means by which it may be updated to include future devices without necessitating the rewriting of the low level device drivers used with such devices.

By using a query command that returns data indicating the physical properties of the array, the interface allows array driver initialization so that the plurality of commands that are generated by a processor are adapted to cause operations to take place in the manner best suited to the physical properties of the array. The central processing unit in a system using a flash memory array with an interface 30 may read the registers 32–58 to determine how it is to interface to the array. This combination of these registers 32–58 and similar registers, a query command, and a query memory allows different flash memory arrays from different manufacturers to use the interface 30 and provide responses for which the response of standard system drivers may be adjusted.

FIG. 4 illustrates one embodiment of data that may be stored in a query ROM 31 and returned in response to a query command received at the command register 32. The data may be returned in a serial string in which a first sixteen bytes are reserved for the transfer of data specific to a particular flash memory vendor. A next eleven bytes are used to transfer data describing a particular command set available to be used with the flash array. Of this eleven bytes of data, a first three bytes are used to transfer a query string indicator such as the ASCII value for "QRY." This indicates to the computer that the array is able to accept and is responding to the query command. A next two bytes are used to transfer a sixteen bit identification code defining a specific generic vendor command set used by this particular flash memory device 27. In general, such a command set is a defined command set that is available as a standard to any vendor for use in a device driver. Such a command set may be used by one or more than one vendor but specifies exactly the basic commands with which the interface functions. The next two bytes then transfer an address for an extended portion of generally unlimited extent that may add to the command set defined by the last two bytes. This address allows a vendor to extend the primary command set by commands that the vendor desires as a part of the command set for the flash memory device 27. In general, such additional commands are defined in the same manner as are the commands available in generic command sets of the device drivers. In FIG. 4, two sections referred to as "Offset address P" and "Offset address A" provide variable length space for transferring data defining primary and alternate extended query tables elements. In this manner, a vendor may add additional commands specific to the flash storage device to be implemented by the device driver. A next two bytes are used to transfer sixteen bits of data indicating a second generic command set that may be implemented by the flash memory device 27. A last two bytes are used to transfer the address for extensions to this alternate command set for the flash memory device 27.

This arrangement allows a vendor to use a primary basic set of commands for operating the array, to add additional commands to the primary basic set of commands for carrying out the functions of the array, to use a second basic set of commands for operating the array, and to add additional commands to the second basic set of commands for carrying out the functions of the array. This allows a vendor to add additional commands as improvements are added to the flash memory device 27. The data transferred in response to the query command then allows a device driver to be modified to provide the correct command set for implementing the operations of the array.

FIG. 4 also illustrates a second twelve bytes that provide a description of the system interface and are returned in response to a query command. For the embodiment illustrated, a first byte defines the minimum power supply voltage used with the array in its normal operating condition. A second byte defines the maximum power supply voltage used with the array in its normal operating condition. A third byte defines the minimum power supply voltage used with the array in its programming condition. A fourth byte defines the maximum power supply voltage used with the array in programming condition. The next eight bytes define various system timing parameters for different operations.

These values allow the initialization of device drivers to provide correct values for each of the particular operations that the array implements in carrying out its read, write, copy, and erase functions.

FIG. 4 also illustrates an additional ten bytes that may be used for the embodiment illustrated to transfer data defining the particular geometry of the flash memory device 27. For this embodiment, a first byte is used to define the flash memory device size. A second two bytes are used to describe the interface, e.g., asynchronous 8 bits, asynchronous 16 bits, or both. A third two bytes defines the maximum number of bytes in a multi-byte write. In one embodiment of the invention, erase blocking is used to make the one or more blocks within an erase block region of the array "read only." Erase blocks of different sizes may exist. A fourth byte defines the number of such erase block regions in a device. A fifth four bytes defines the size and number of erase blocks in an erase block of an array. By defining the number and sizes of different erase blocks that exist in the array, a software driver may be apprised of different areas that may be made "read only" or that may be erased in a single operation.

All of these values are also used to initialize the driver used with the particular flash memory device 27 so that it may efficiently deal with the array.

Once the device drivers have been initialized to the values of the particular flash memory device 27, various commands may be used and the flash memory device 27 will accept those commands. The write, read, and erase commands cause similar operations as with the flash disk device 17 of FIG. 2 as the flash translation layer driver translates such disk commands into flash primitive commands executable by the low level driver. The proper translation of requests for data transfer of specific disk-primitive units, or sectors, into variable flash device specific block erasure and byte or buffer write commands is facilitated by the knowledge of the software drivers of the flash memory device of erase block sizes, erase block region sizes, write buffer size, and the size of the entire device array. The information provided by reading out the contents of the query ROM 31 allows the device drivers of the flash disk emulator to emulate various sizes of disk drives such as the electromechanical drive 16 or the flash disk drive 17 using any of combination of different flash memory devices 27 within a flash memory card 18 or other flash memory array used within a flash disk emulator. Moreover, this information is even useful for simplifying the firmware within a flash disk drive 17 containing flash memory devices 27 implemented in the manner of the current invention such that the same firmware will allow the use of flash disk drives yet to be manufactured using newer flash memory devices with upgraded features or larger capacities.

The flash memory device commands also allow a portion of the array to be made "read only" for particular operations. Data stored in a "read only" erase block region of the array may then be read directly from the array in a mode in which data is accessed on a row and column basis. Such a "read only" portion of the array may be used to execute programs directly from the array.

In such a case, data is written to the flash memory device 27 in the typical manner through a device command interface 30 that is associated with state machines for accomplishing the various accessing and control operations including a write state machine 66 used with each chip for writing, copying, and erasing the blocks of flash memory. However, when the data for direct code execution is written, the blocks 68 in which the data is stored are marked as "read only." This causes the application instructions in the blocks to remain in file order rather than to become discontiguously arranged. Consequently, the file need not be reassembled externally before the instructions are executed. Then a read of the instructions constituting an application takes place in a separate read array mode of the flash memory device 27. This mode may be initiated by a read array command that causes the flash memory device 27 to function in the read array mode. Alternatively, a separate read array pin may be provided. The read array mode selection allows a processor or other bus master to directly read data from the flash memory device 27 by providing the appropriate chip, block, row, and column read addresses with the command. For multi level cell devices that require error detection and correction, all read /write accesses should go through the register interface so that special error detection and correction circuitry can be employed for reliably reading back the data. However, multilevel cell devices supporting single bit per cell (reliable mode) operation may use array read mode for direct code execution through row and column accessing.

When in this read array mode, the instructions stored in the array may be read from the array as rapidly as instructions are typically read from DRAM memory. For this reason, the array may be used not only to replace long term memory such as a rotating disk drive, but also to replace certain of the main memory functions where data is not rapidly changing but need only be read form the array.

In the foregoing specification, the invention has been described with reference to specific exemplary embodiments thereof. It will, however, be evident that various modifications and changes may be made therein without departing from the broader spirit and scope of the invention as set forth in the appended claims. The specification and drawings are, accordingly, to be regarded in an illustrative rather than a restrictive sense.

What is claimed is:

1. A flash EEPROM memory device comprising:

a memory array including a plurality of blocks of flash EEPROM memory cells arranged to be accessed in rows and columns, a query memory storing data defining characteristics of the flash storage device, and a register interface for receiving data and commands addressed to the blocks of flash EEPROM memory devices and generating signals for adapting the purpose of the commands in the device based on the data, the interface including a command register for receiving commands and a plurality of registers for providing the data stored in the query memory as output.

2. A flash EEPROM memory device as claimed in claim 1 in which the query memory stores data descriptions of standard characteristics of the device and of the memory array including a plurality of blocks of flash EEPROM memory cells defined in primitives of the memory array.

3. A flash EEPROM memory device as claimed in claim 2 in which the interface for receiving data and commands further comprises a circuit for directly accessing the plurality of blocks of flash EEPROM memory cells from a system bus to read data at row and column addresses defined in primitives of the memory array.

4. A flash EEPROM memory device as claimed in claim 1 in which the interface for receiving data and commands further comprises a circuit for directly accessing the plurality of blocks of flash EEPROM memory cells from a system bus using row and column addressing to read data.

5. A flash EEPROM memory device as claimed in claim 1 in which the register interface for receiving data and commands further comprises a state machine for accessing the plurality of blocks of flash EEPROM memory cells, the register interface providing a selectable mode including a circuit for reading directly for the plurality of blocks of flash EEPROM memory cells without utilizing the state machines.

6. A flash EEPROM memory device as claimed in claim 1 in which the plurality of registers for providing the data stored in the query memory as output comprises:

a status register, a register storing access addresses, a register storing addresses to which data is to be copied, and a register storing data defining an amount of data to be transferred.

7. A flash EEPROM memory device as claimed in claim 6 in which the plurality of registers for providing the data stored in the query memory as output further comprises a register storing addresses of data to be erased sequentially.

8. A method for accessing a device including a flash EEPROM memory comprising the steps of:

directing a query command to a register of the device, decoding the query command in the register, querying the device to determine its characteristics in flash EEPROM memory primitives, placing characteristics of the device in a plurality of characteristic registers of the device, initializing a device driver for the device using the characteristics in the characteristic registers, writing data to the device using the characteristics determined through a register interface providing state machines for erasing and writing to the flash EEPROM memory.

9. A method as claimed in claim 8 further comprising the steps of establishing a portion of the data written to the flash EEPROM memory as read only, and reading the portion of the data written to the flash EEPROM memory as read only from the device by means of a read command utilizing direct row and column addressing of the flash EEPROM memory.

10. A method accessing a device as claimed in claim 9 in which the step of querying the device to determine its characteristics in flash EEPROM memory primitives includes reading data defining the characteristics from a query memory in the device.

11. A computer system comprising:

a central processing unit;

main memory;

a bus joining components of the computer system to the central processing unit and main memory; and a device joined to the bus comprising:

a memory array including a plurality of blocks of flash EEPROM memory arranged to be accessed in rows and columns, a query memory storing data defining characteristics of the flash EEPROM memory, and a register interface for receiving data and commands addressed to the blocks of flash EEPROM memory devices and generating signals for adapting the purpose of the commands in the device based on the data, the interface including a command register for receiving commands and a plurality of registers for providing data stored in the query memory as output.

12. A computer system as claimed in claim 11 in which the query memory stores data which describes the standard characteristics of the device in primitives of the flash EEPROM memory.

13. A computer system as claimed in claim 12 in which the register interface for receiving data and commands further comprises circuitry for directly accessing the plurality of blocks of flash EEPROM memory from a system bus to read data at row and column addresses defined in primitives of the flash EEPROM memory.

* * * * *